United States Patent
VanGilder et al.

(10) Patent No.: US 10,274,978 B2
(45) Date of Patent: Apr. 30, 2019

(54) DROPPED CEILING SYSTEM COOLING PREDICTION

(71) Applicant: SCHNEIDER ELECTRIC IT CORPORATION, West Kingston, RI (US)

(72) Inventors: James William VanGilder, Pepperell, MA (US); Xuanhang Zhang, North Reading, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 32 days.

(21) Appl. No.: 15/662,449

(22) Filed: Jul. 28, 2017

(65) Prior Publication Data
US 2017/0322572 A1 Nov. 9, 2017

Related U.S. Application Data

(62) Division of application No. 14/366,785, filed as application No. PCT/US2011/067124 on Dec. 23, 2011, now Pat. No. 9,727,064.

(51) Int. Cl.
| | | |
|---|---|---|
| *G06F 1/20* | (2006.01) | |
| *H05K 7/20* | (2006.01) | |
| *G05D 23/19* | (2006.01) | |

(52) U.S. Cl.
CPC ......... *G05D 23/1917* (2013.01); *G06F 1/206* (2013.01); *H05K 7/20745* (2013.01); *H05K 7/20836* (2013.01); *Y02D 10/16* (2018.01)

(58) Field of Classification Search
None
See application file for complete search history.

(56) References Cited

U.S. PATENT DOCUMENTS

| | | |
|---|---|---|
| 7,881,910 B2 | 2/2011 | Rasmussen et al. |
| 7,991,592 B2 | 8/2011 | VanGilder et al. |
| | (Continued) | |

FOREIGN PATENT DOCUMENTS

WO  2008/144375 A2  11/2008

OTHER PUBLICATIONS

Healey, C., et al., "Potential-Flow Modeling for Data Center Applications," Proceedings of the ASME 2011 Pacific Rim Technical Conference & Exposition on Packaging and Integration of Electronic and Photonic Systems, IPACK2011-52136, Jul. 6-8, 2011.

(Continued)

*Primary Examiner* — Ryan A Jarrett
(74) *Attorney, Agent, or Firm* — Lando & Anastasi, LLP

(57) ABSTRACT

In one embodiment, there is provided a computer-implemented method for evaluating ceiling plenum airflow patterns and cooling performance of equipment in a data center. The method includes receiving data related to equipment in the data center, receiving data related to the ceiling plenum, determining first parameters related to airflow and to pressure in the ceiling plenum using a first airflow model, determining second parameters related to airflow through a plurality of equipment racks and to pressure across the plurality of equipment racks using a second airflow model distinct from the first airflow model, determining a coupling relationship between airflow through the equipment racks and airflow into the ceiling plenum, adjusting the first parameters based on at least the second parameters and the coupling relationship, determining a sufficiency of airflow through the equipment racks, and storing, on a storage device, an indication of the sufficiency of airflow through the equipment racks.

16 Claims, 9 Drawing Sheets

(56) References Cited

U.S. PATENT DOCUMENTS

| | | | |
|---|---|---|---|
| 8,825,451 | B2 | 9/2014 | VanGilder et al. |
| 8,972,217 | B2 | 3/2015 | VanGilder et al. |
| 8,996,180 | B2 | 3/2015 | VanGilder et al. |
| 2002/0108386 | A1 | 8/2002 | Spinazzola et al. |
| 2008/0174954 | A1* | 7/2008 | VanGilder .......... H05K 7/20745 361/679.54 |
| 2009/0138313 | A1 | 5/2009 | Morgan et al. |
| 2009/0326879 | A1 | 12/2009 | Hamann et al. |
| 2010/0131109 | A1 | 5/2010 | Rasmussen et al. |
| 2010/0252233 | A1 | 10/2010 | Absalom |
| 2010/0286956 | A1 | 11/2010 | VanGilder et al. |
| 2011/0040529 | A1 | 2/2011 | Hamann et al. |
| 2012/0041569 | A1 | 2/2012 | Zhang et al. |
| 2012/0245905 | A1 | 9/2012 | Dalgas et al. |
| 2013/0006426 | A1 | 1/2013 | Healey et al. |

OTHER PUBLICATIONS

International Search Report from corresponding PCT/US2011/067124 dated Apr. 27, 2012.

Refai-Ahmed G. et al., "Analysis of flow distribution in power supply using flow network modeling (FNM)", Thermal and Thermomechanical Phenomena in Electronic Systems, 2000, IT HERM 2000, The Seventh Intersociety Conference on May 23-26, 2000, Piscataway, NJ, USA, IEEE, Piscataway, NJ, USA, vol. 1, May 23, 2000 (May 23, 2000), pp. 90-98, ISBN: 978-0-7803-5912-3.

Shrivastava S.K. et al., "A flow-network model for predicting rack cooling in containment systems", Proceedings of the ASME Interpack Conference—2009: Presented at 2009 ASME Interpack Conference, Jul. 19-23, 2009, San Francisco, California, USA, vol. 2, Jul. 19, 2009 (Jul. 19, 2009), pp. 785-791

Sinha et al., "Numerical simulation of two-dimensional room air flow with and without buoyancy", Energy and Buildings, vol. 32, Issue 1, Jun. 2000, pp. 121-129.

Supplementary European Search Report from corresponding EP Application No. 11878078.2 dated Jul. 10, 2015.

Toulouse M.M. et al., "Exploration of a potential-flow-based compact model of air-flow transport in data centers", Proceedings of the ASME International Mechanical Engineering Congress and Exposition-2009: Presented at 2009 ASME International Mechanical Engineering Congress and Exposition, Nov. 13-19, 2009, Lake Buena Vista, Florida, USA, vol. 13: New Del, vol. 13, Jan. 1, 2009 (Jan. 1, 2009), pp. 41-50, DOI: 10.1115/IMECE2009-10806, ISBN: 978-0-7918-4386-4.

Vanessa Lopez et al: "Heat transfer modeling in data centers", International Journal of Heat and Mass Transfer, vo 1 . 54, No. 25, Sep. 15, 2011 (Sep. 15, 2011), pp. 5306-5318, XP028298268, ISSN: 0017-9310, DOI: 10.1016/J.IJHEATMASSTRANSFER.2011.08.012 [retrieved on Aug. 10, 2011].

Vangilder, James: "Real-Time Data Center Cooling Analysis", ElectronicsCOOLING, Sep. 8, 2011, pp. 14-16.

* cited by examiner

DROPPED CEILING SYSTEM COOLING PREDICTION

CROSS-REFERENCE TO RELATED APPLICATIONS

This patent application is a divisional patent application of U.S. patent application Ser. No. 14/366,785 filed on Dec. 23, 2011 [now U.S. Pat. No. 9,727,064], titled, "DROPPED CEILING SYSTEM COOLING PREDICTION," which is a U.S. National Stage Application under 35 U.S.C. § 371 from International Application No. PCT/US2011/067124, filed Dec. 23, 2011, titled, "DROPPED CEILING SYSTEM COOLING PREDICTION," both of which are hereby incorporated by reference in their entirety for all purposes.

BACKGROUND

Field of the Invention

At least one embodiment in accordance with the present invention relates generally to systems and methods for data center management and design, and more specifically, to systems and methods for predicting airflow and temperature distribution within an overhead air plenum.

Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these rows are organized into hot and cold aisles to decrease the cost associated with cooling the information technology equipment. Some data center designs centers utilize a raised-floor plenum for distributing cooling airflow to information technology (IT) equipment housed in racks. Ceiling plenums are occasionally used with or without a raised-floor plenum as a way to efficiently return rack exhaust air to computer room air conditioners (CRACs) before it can mix with air in other parts of the data center. In some designs, a dropped ceiling, similar to that used in commercial and residential buildings, is used to create the ceiling plenum. Perforated tiles may be placed above hot equipment, e.g., above the hot aisles, and CRAC units may be ducted to the dropped ceiling. Sometimes, racks or entire hot aisles are ducted directly to the dropped ceiling Various processes and software applications, such as the data center management systems available from American Power Conversion (APC) Corporation of West Kingston, R.I., have been developed to aid data center personnel in designing and maintaining efficient and effective data center configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

SUMMARY OF THE INVENTION

A first aspect of the invention is directed to a computer-implemented method for evaluating ceiling plenum airflow patterns and cooling performance of equipment in a data center, the equipment including a plurality of equipment racks and at least one cooling provider. The method includes receiving data related to types of equipment and an arrangement of equipment in the data center, receiving data related to a configuration of the ceiling plenum, determining first parameters related to airflow and first parameters related to pressure in the ceiling plenum using a first airflow model, determining second parameters related to airflow through the plurality of equipment racks and second parameters related to pressure across the plurality of equipment racks using a second airflow model distinct from the first airflow model, determining a coupling relationship between airflow through the plurality of equipment racks and airflow into the ceiling plenum, adjusting the first parameters based on at least the second parameters and the coupling relationship, determining a sufficiency of airflow through the plurality of equipment racks, and storing, on a storage device, an indication of the sufficiency of airflow through the plurality of equipment racks.

In accordance with some embodiments, the method further comprises determining airflows through one or more perforated tiles in the ceiling plenum.

In accordance with some embodiments, the method further comprises determining airflow through one or more ducts carrying air to the ceiling plenum from one or more of the plurality of equipment racks.

In accordance with some embodiments, the method further comprises incorporating leakage airflow through one or more pieces of equipment in the determination of the first parameters related to airflow.

In accordance with some embodiments, the method further comprises determining an absolute value of pressure in one of the ceiling plenum and an inlet of one of the plurality of equipment racks.

In accordance with some embodiments, the method further comprises determining a ratio of airflow through a duct of at least one of the plurality of equipment racks to airflow introduced into the at least one of the plurality of equipment racks and displaying the ratio on an output device.

In accordance with some embodiments, the method further comprises determining a room air temperature in the data center, exhaust air temperatures of the plurality of equipment racks, and air temperatures within the ceiling plenum.

In accordance with some embodiments, the method further comprises displaying the determined air temperatures within the ceiling plenum on an output device.

Another aspect of the invention is directed to a system for evaluating ceiling plenum airflow patterns and cooling performance of equipment in a data center, the equipment including a plurality of equipment racks and at least one cooling provider. The system includes an interface and a controller coupled to the interface. The controller is configured to receive data related to types of equipment and an arrangement of equipment in the data center, receive data related to a configuration of the ceiling plenum, determine first parameters related to airflow and first parameters related to pressure in the ceiling plenum using a first airflow model, determine second parameters related to airflow through the plurality of equipment racks and second parameters related to pressure across the plurality of equipment racks using a second airflow model distinct from the first airflow model, determine a coupling relationship between airflow through the plurality of equipment racks and airflow into the ceiling plenum, adjust the first parameters based on at least the second parameters and the coupling relationship, determine a sufficiency of airflow through the plurality of equipment racks, and store, on a storage device, an indication of the sufficiency of airflow through the plurality of equipment racks.

In accordance with some embodiments, the controller is further configured to determine airflows through one or more perforated tiles in the ceiling plenum.

In accordance with some embodiments, controller is further configured to determine airflow through one or more ducts carrying air to the ceiling plenum from one or more of the plurality of equipment racks.

In accordance with some embodiments, the controller is further configured to incorporate leakage airflow through one or more pieces of equipment in the determination of the first parameters related to airflow.

In accordance with some embodiments, the controller is further configured to an absolute value of pressure in one of the ceiling plenum and an inlet of one of the plurality of equipment racks.

In accordance with some embodiments, the controller is further configured to a ratio of airflow through a duct of at least one of the plurality of equipment racks to airflow introduced into the at least one of the plurality of equipment racks and to display the ratio on an output device.

In accordance with some embodiments, the controller is further configured to a room air temperature in the data center, exhaust air temperatures of the plurality of equipment racks, and air temperatures within the ceiling plenum.

In accordance with some embodiments, the controller is further configured to display the determined air temperatures within the ceiling plenum on an output device.

Another aspect of the invention is directed to a computer readable medium having stored thereon sequences of instruction including instructions that will cause a processor to receive data related to types of equipment and an arrangement of equipment in a data center, receive data related to a configuration of a ceiling plenum in the data center, determine first parameters related to airflow and first parameters related to pressure in the ceiling plenum using a first airflow model, determine second parameters related to airflow through a plurality of equipment racks in the data center and second parameters related to pressure across the plurality of equipment racks using a second airflow model distinct from the first airflow model, determine a coupling relationship between airflow through the plurality of equipment racks and airflow into the ceiling plenum, adjust the first parameters based on at least the second parameters and the coupling relationship, determine a sufficiency of airflow through the plurality of equipment racks, and store, on a storage device, an indication of the sufficiency of airflow through the plurality of equipment racks.

In accordance with some embodiments, the sequences of instructions further include instructions that will cause the processor to determine a ratio of airflow through a duct of at least one of the plurality of equipment racks to airflow introduced into the at least one of the plurality of equipment racks and displaying the ratio on an output device.

In accordance with some embodiments, the sequences of instructions further include instructions that will cause the processor to display the ratio on the output device overlayed on a graphical representation of the equipment.

In accordance with some embodiments, the sequences of instructions further include instructions that will cause the processor to determine a room air temperature in the data center, exhaust air temperatures of the plurality of equipment racks, and air temperatures within the ceiling plenum and to display the determined air temperatures within the ceiling plenum on an output device.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
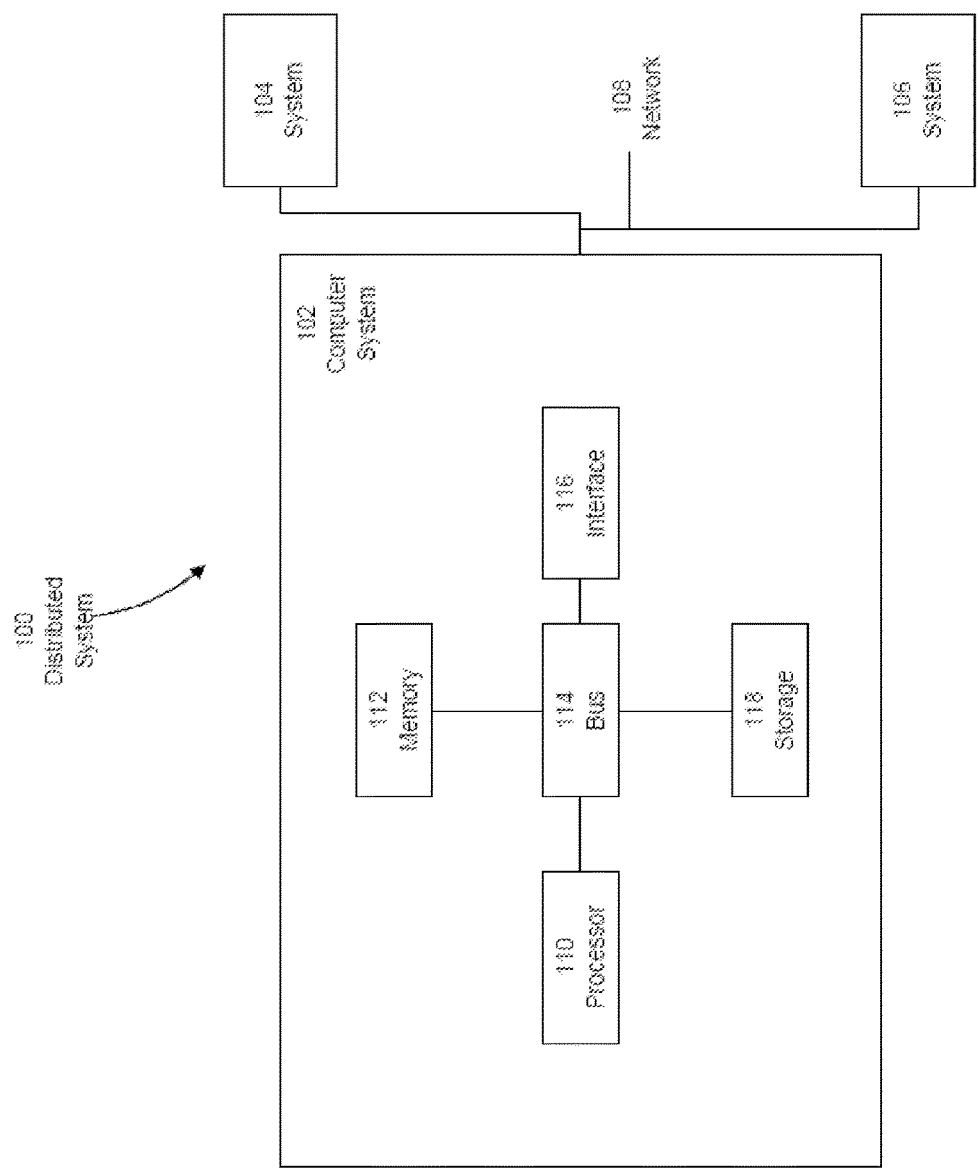
FIG. 1 is a block diagram of one example of a computer system with which various aspects in accord with the present invention may be implemented.

At least some embodiments in accordance with the present invention relate to systems and processes through which a user may design and analyze data center configurations. These systems and processes may facilitate this design and analysis activity by allowing the user to create models of data center configurations from which performance metrics may be determined. Both the systems and the user may employ these performance metrics to determine alternative data center configurations that meet various design objectives. Further, in at least one embodiment, a system provides modeling and prediction of airflow and/or temperature distributions for a proposed layout of a data center equipment and also provides prediction of cooling performance for an installed or planned data center.

As described in U.S. Pat. No. 7,991,592, titled "System and Method for Evaluating Equipment Rack Cooling," issued Aug. 2, 2011 (referred to herein as "the '592 patent"), in U.S. patent application Ser. No. 11/342,300, titled "Methods and Systems for Managing Facility Power and Cooling," filed Jan. 27, 2006 (referred to herein as "the '300 application"), in U.S. patent application Ser. No. 12/884,832, titled "System and Method for Predicting Perforated Tile Airflow in a Data Center," filed Sep. 17, 2010 (referred to herein as "the '832 application"), and U.S. patent application Ser. No. 12/795,862, titled "System and Method for Predicting Temperature Values in a Data Center," filed Jun. 8, 2010 (referred to herein as "the '862 application"), each of which are assigned to the assignee of the present application, and each of which is hereby incorporated herein by reference in its entirety for all purposes, typical equipment racks in modern data centers draw cooling air into the front of the rack and exhaust air out of the rear of the rack. The equipment racks and in-row coolers are in some designs arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool aisle cluster, and adjacent rows of equipment racks separated by a hot aisle may be referred to as a hot aisle cluster. Further, single rows of equipment may also be considered to form both a cold and a hot aisle cluster by themselves. A row of equipment racks may be part of multiple hot aisle clusters and multiple cool aisle clusters. In descriptions and claims herein, equipment in racks, the racks themselves, or other heat producing equipment may be referred to as cooling consumers, and in-row cooling units, CRACs, computer room air handlers (CRAHs), and/or other forms of cooling equipment may be referred to as cooling providers. In the referenced applications, tools are provided for analyzing the cooling performance of a cluster of racks in a data center. In these tools, multiple analyses may be performed on different layouts to attempt to optimize the cooling performance of the data center.

In some instances when individual racks are ducted, the rear of the rack may be generally substantially sealed to airflow while the roof of the rack may be substantially removed so that rack exhaust is directed into the ceiling plenum. In some instances when entire hot aisles are ducted, the rack structure may be left substantially unchanged from the un-ducted configurations although sometimes the rear doors may be removed. With ducted hot aisles, doors may be added to the ends of the aisle and either ductwork or solid panels may cover the top of the hot aisle so that, again, the rack exhaust is directed into the ceiling plenum.

In data centers utilizing an overhead plenum to, for example, return rack exhaust air to a cooling unit such as a CRAC, airflow through perforated ceiling tiles in the overhead plenum may not be uniform from tile to tile. The non-uniformity may be adversely affected by shallow plenum depth, the use of very large open-area tiles, geometric configuration, leakage airflow through unintended openings, etc. In applications in which all equipment is ducted, one might assume that reliable cooling is guaranteed as all hot exhaust appears captured. However, uneven pressurization of the ceiling plenum may result in increased or decreased equipment airflow rates, and rack exhaust may escape through leakage paths back into the room. For example, identical ducted IT equipment may deliver substantially different airflow rates depending on their proximity to one or more CRACs and each other as well as other ceiling-plenum design parameters. Additionally, the temperature distribution in the ceiling plenum may be substantially non-uniform which may lead to load imbalances amongst the CRACs in designs including multiple CRACs. It is considered beneficial for the data center designer or operator to be able to predict the airflow and temperatures throughout the ceiling-plenum system to assure that the design will work as intended and to avoid costly trial-and-error.

In at least one embodiment, a method is provided for performing, in real-time, an analysis of airflows and temperatures throughout a ceiling-plenum system. Although discussed herein in the context of data center air plenums, aspects and embodiments of the invention may apply to other air plenums, for example, those in commercial or office buildings, in semiconductor manufacturing clean-rooms, or in other structures. Some aspects and embodiments of the invention involve coupling a Potential Flow Model (PFM) used to model ceiling plenum airflow to a Flow Network Model (FNM) which is used to compactly represent the characteristics of the IT equipment in a data center.

Aspects disclosed herein in accordance with the present embodiments, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling, and presenting information regarding specific data center configurations. Further, computer systems in embodiments may be used to automatically measure environmental parameters in a data center, and control equipment, such as chillers or coolers to optimize performance. Moreover, the systems described herein may be configured to include or exclude any of the functions discussed herein. Thus, the embodiments are not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present embodiments may be implemented as hardware or software on one or more computer systems. There are many examples of computer systems currently in use. These examples include, among others, network appliances, personal computers, workstations, mainframes, networked clients, servers, media servers, application servers, database servers, and web servers. Other examples of computer systems may include mobile computing devices, such as cellular phones and personal digital assistants, and network equipment, such as load balancers, routers and switches. Further, aspects in accordance with the present embodiments may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the embodiments are not limited to executing on any particular system or group of systems. Further, aspects may be implemented in software, hardware or firmware, or any combination thereof. Thus, aspects in accordance with the present embodiments may be implemented within methods, acts, systems, system elements and components using a variety of hardware and software configurations, and the embodiments are not limited to any particular distributed architecture, network, or communication protocol.

FIG. 1 shows a block diagram of a distributed computer system 100, in which various aspects and functions in accord with the present embodiments may be practiced. Distributed computer system 100 may include one more computer systems. For example, as illustrated, distributed computer system 100 includes computer systems 102, 104, and 106. As shown, computer systems 102, 104, and 106 are interconnected by, and may exchange data through, communication network 108. Network 108 may include any communication network through which computer systems may exchange data. To exchange data using network 108, computer systems 102, 104, and 106 and network 108 may use various methods, protocols and standards, including, among others, token ring, Ethernet, wireless Ethernet, Bluetooth, TCP/IP, UDP, Http, FTP, SNMP, SMS, MMS, SS7, Json, Soap, and Corba. To ensure data transfer is secure, computer systems 102, 104, and 106 may transmit data via network 108 using a variety of security measures including TLS, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present embodiments may be implemented as specialized hardware or software executing in one or more computer systems including computer system 102 shown in FIG. 1. As depicted, computer system 102 includes processor 110, memory 112, bus 114, interface 116, and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor, multi-processor, microprocessor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile, non-transitory, storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI, and InfiniBand. Thus, bus 114 enables communications, for example, data and instructions, to be exchanged between system components of computer system 102.

Computer system 102 also includes one or more interface devices 116 such as input devices, output devices, and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable, nonvolatile, non-transitory, storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk, or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then may copy the data to the medium associated with storage system 118 after processing is completed. A variety of components may manage data movement between the medium and integrated circuit memory element and the presently described embodiments are not limited thereto. Further, the embodiments are not limited to a particular memory system or data storage system.

Although computer system 102 is shown by way of example as one type of computer system upon which various aspects and functions in accordance with the present embodiments may be practiced, any aspects of the presently disclosed embodiments are not limited to being implemented on the computer system as shown in FIG. 1. Various aspects and functions in accord with the presently disclosed embodiments may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system such as Windows NT, Windows 2000 (Windows ME), Windows XP, or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C-, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML, or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB, a subsidiary of Oracle or integration software such as Web Sphere middleware from IBM of Armonk, N.Y. However, a computer system running, for example, SQL Server may be able to support both aspects in accord with the presently disclosed embodiments and databases for sundry applications.

Example System Architecture

Figure 2:
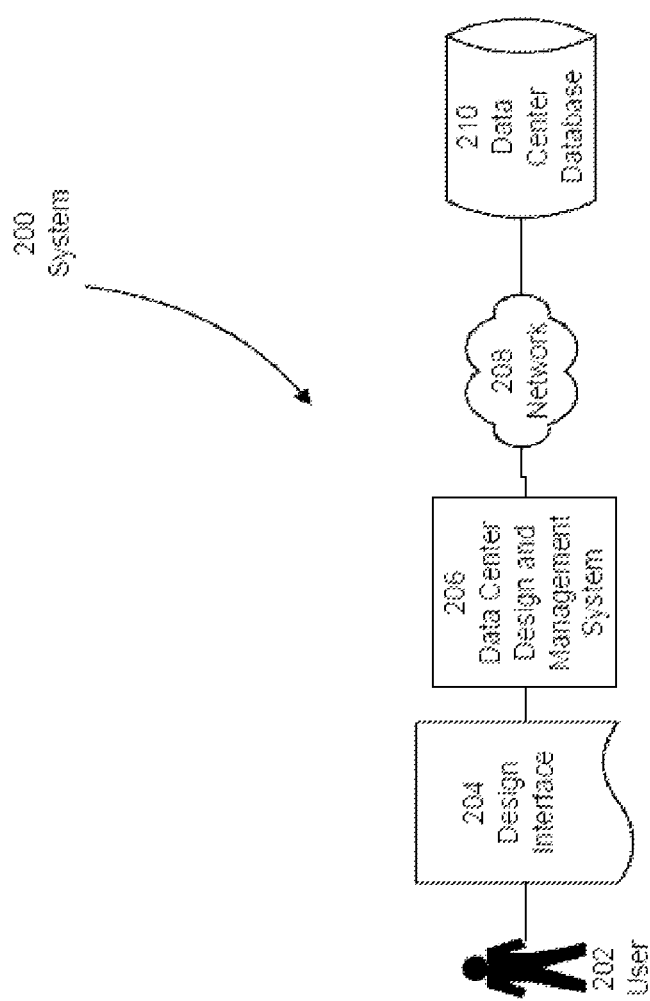
FIG. 2 a schematic of one example of a distributed system including a data center management system.

FIG. 2 presents a context diagram including physical and logical elements of distributed system 200. As shown, distributed system 200 is specially configured in accordance with the presently disclosed embodiments. The system structure and content recited with regard to FIG. 2 is for exemplary purposes only and is not intended to limit the embodiments to the specific structure shown in FIG. 2. As will be apparent to one of ordinary skill in the art, many variant system structures can be architected without deviating from the scope of the presently disclosed embodiments. The particular arrangement presented in FIG. 2 was chosen to promote clarity.

Information may flow between the elements, components, and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the presently disclosed embodiments.

Referring to FIG. 2, system 200 includes user 202, interface 204, data center design and management system 206, communications network 208, and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, titled "Methods and Systems for Managing Facility Power and Cooling," filed on May 15, 2008, which is incorporated herein by reference in its entirety and is hereinafter referred to as PCT/US08/63675. In other embodiments, interface 204 may be implemented with specialized facilities that enable user 202 to design, in a drag and drop fashion, a model that includes a representation of the physical layout of a data center or any subset thereof. This layout may include representations of data center structural components as well as data center equipment. The features of interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information needed to support the features and functions of data center design and management system 206. For example, in one embodiment, data center database 210 may include at least some portion of the data stored in the data center equipment database described in PCT/US08/63675. In another embodiment, this information may include any information needed to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store types of cooling providers, the amount of cool air provided by each type of cooling provider, and a temperature of cool air provided by the cooling provider. Thus, for example, data center database 210 includes records of a particular type of CRAC unit that is rated to deliver airflow at the rate of 5,600 cubic feet per minute (cfm) at a temperature of 68 degrees Fahrenheit. In addition, the data center database 210 may store one or more cooling metrics, such as inlet and outlet temperatures of the CRACs and inlet and exhaust temperatures of one or more equipment racks. The temperatures may be periodically measured and input into the system, or in other embodiments, the temperatures may be continuously monitored using devices coupled to the system 200.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, embodiments of the invention are not limited to a specific number of users or systems.

Ceiling Plenum Airflow

In accordance with some aspects and embodiments, an approach to determining ceiling plenum airflow uses methods disclosed in the '832 application in which a PFM technique was described for modeling raised-floor plenums and, ultimately, determining perforated tile flow rates. In accordance with some aspects and embodiments, the Flow Network Model of IT equipment uses methods disclosed in U.S. patent application Ser. No. 12/970,605, titled "System and Method for Rack Cooling Analysis," filed Dec. 16, 2010 (referred to herein as "the '605 application"), which is incorporated herein in its entirety for all purposes.

In the discussion and examples which follow, the term "cooler" is used generically to mean all types of cooling units including chilled-water and refrigerant-based equipment such as row-based coolers, CRACs, and CRAHs. Additionally, aspects and embodiments of the invention are described with the aid of simple two-dimensional (2D) examples and example equation formulations for specific scenarios. Aspects and embodiments of the invention can be extended to more general data center layouts and three-dimensional (3D) applications without loss of generality.

One option for predicting the cooling performance of equipment in a dropped-ceiling data center is to use Computational Fluid Dynamics (CFD). With CFD, rack characteristics must be specified with a reasonable amount of detail—including the inner structure of the rack; such models are necessarily large and run very slowly for practical facilities. Further, CFD is very expensive and requires a skilled operator, and, therefore, is not readily accessible to data center designers and operators. By contrast, aspects and embodiments of the method of the present invention are stable, fast, and easily incorporated into stand-alone tools or broader design and management packages like InfraStruXure™ Designer or StruxureWare™ for Operations, available from American Power Conversion Corporation, West Kingston, R.I.

The cooling performance of un-ducted equipment in, for example, a data center, may be affected by the addition of a dropped-ceiling system. In one example, a data center includes a dropped ceiling including a plenum to which CRAC units are ducted, and IT equipment (for example, equipment racks) which is not ducted to the dropped ceiling. Perforated ceiling tiles may be placed above or near the hot aisles to capture hot rack exhaust before it can mix with other air in the data center. In this case, the cooling performance of the dropped-ceiling system can be computed in real-time following a method similar to that described in the '592 patent. As described in the '592 patent, a cooling algorithm for a hot-aisle configuration may be based on an assumption that rack-cooler interactions depend primarily on the magnitude of airflow associated with the racks and coolers and their relative geometric positions. A rack at each location in a row of equipment racks (or a narrower slice along the row) can be thought of having a certain potential to supply airflow to other locations. This potential varies inversely with the distance of separation. Furthermore, the amount of airflow a rack can supply to other locations increases as its own total airflow increases. It can be found that the net airflow, which can be supplied to a particular location $A_i$ in Row A, can be adequately represented as follows:

$$(Q_{Ai})_{sup\,net} = \sum_j^{all\,racks} (Q_{Aj})_{sup\,self} e^{-B\Delta x} \cdot D \cdot \sum_j^{all\,racks} (Q_{Bj})_{sup\,self} e^{-B\Delta x} \quad (1)$$

where $(Q_{Ai})_{sup\,net}$ is the net maximum airflow that can be supplied to location $A_i$ including contributions from all racks.

$(Q_{Aj})_{sup\,self}$ is the airflow supplied by just the rack itself at location $A_j$.

$(Q_{Bj})_{sup\,self}$ is the airflow supplied by just the rack itself at location $B_j$.

$\Delta x$ is the horizontal distance between the center of location i and j (in feet).

B is an empirical constant.

D is the empirical "coupling" constant accounting for effects from the opposite row.

The net maximum airflow that can be supplied to various locations in Row B is computed in the same manner.

The fraction of air ($f_{ij}$) supplied at rack i location, including the contributions from all racks, which is captured by a cooler j is given by:

For Racks in Row A and Coolers in Row A $$f_{ij}^{coolers} = \frac{(Q_{Aj})_{cap\,self} e^{-A\Delta x}}{(Q_{Ai})_{sup\,net}} \quad (2)$$

For Racks in Row A and Coolers in Row B $$f_{ij}^{coolers} = \frac{C \cdot (Q_{Bj})_{cap\,self} e^{-A\Delta x}}{(Q_{Ai})_{sup\,net}} \quad (3)$$

where $(Q_{Aj})_{cap\,self}$ is the airflow captured by just the cooler j itself at location $A_j$.

$(Q_{Bj})_{cap\,self}$ is the airflow captured by just the cooler j itself at location $B_j$.

$\Delta x$ is the horizontal distance between the center of location i and j (in feet).

A is an empirical constant.

C is an empirical "coupling" constant accounting for effects from the opposite row Calculations for racks in Row B follow analogous equations.

Constants A, B, C, and D may be determined by comparing the results of the algebraic model to actual or known values which, in theory, can be determined from experimental measurements; however, CFD modeling provides a more practical means of generating data for a large number of potential layouts. The constants may take on different values depending on application details such as the type of racks, rack exhaust and surrounding ambient temperatures, etc. Constants A and B may be fixed for the range of typical design parameters with while constants C and D may vary with aisle width, as shown in Table 1.

TABLE 1

Constants vs. Aisle Width for proper hot-aisle clusters

| Constant | Hot Aisle Width (feet) | | | |
|---|---|---|---|---|
| | 3 | 4 | 5 | 6 |
| A | 0.14 | 0.14 | 0.14 | 0.14 |
| B | 0.12 | 0.12 | 0.12 | 0.12 |
| C | 0.92 | 0.83 | 0.75 | 0.66 |
| D | 1.26 | 1.29 | 1.33 | 1.36 |

The coefficients for aisle widths not present in the table may be obtained by linear interpolation or extrapolation. For example, coefficient C can be expressed as C=−0.085*AisleWidth+1.17 and coefficient D can be expressed as D=0.035*AisleWidth+1.15.

Ceiling Tile Capture Index

When calculating the potential of ceiling tiles to capture airflow from any equipment location, each ceiling tile can be thought of as having a certain potential to capture airflow from all equipment locations. The potential of tiles to capture airflow from any equipment position varies inversely with the distance of separation and the amount of airflow a tile can capture increases as its own total airflow increases. Note that the capturing of ceiling tiles is only considered in at least some examples when they are within certain range of a hot-aisle cluster. It is found that the net airflow, which can be captured from a particular rack location $A_i$ by all tiles, can be adequately represented as follows:

$$(Q_{Ai})_{tile\,net} = \sum_{k}^{all\,tiles} (Q_k)_{tile\,self} E e^{-F \cdot Distance(i,k)} \quad (4)$$

where $(Q_{Ai})_{tile\,net}$ is the net maximum airflow that can be captured from location Ai including contributions from all tiles.

$(Q_k)_{tile\,self}$ is the airflow captured by only the ceiling tile k itself.

Distance (i,k) is the distance between the center of the inlet of rack i and the center of ceiling tile k (in feet).

E and F are empirical constants. (E may be, for example, 1 and F may be, for example, 0.01.)

The fraction of air ($f_{ik}^{tiles}$) captured by tile k which is supplied by a rack i is given by:

$$f_{ik}^{tiles} = \frac{(Q_{Ai})_{tile\,net}}{(Q_{Ai})_{sup\,net}} \quad (5)$$

The Hot Aisle Capture Index (HACI) is then estimated as the ratio of net airflow captured and net airflow supplied at any location expressed as a percentage with values capped at 100%.

Finally, the hot aisle capture index for each rack i is computed as:

$$HACI_i = \sum_{j=1}^{all\,coolers} f_{ij}^{coolers} + \sum_{k=1}^{all\,tiles} f_{ik}^{tiles} \quad (6)$$

Having described how the above model can be used to determine cooling performance of racks from known perforated tile airflow rates, methods by which perforated tile airflow rates may themselves be determined and how the cooling performance of ducted racks and racks which are members of ducted hot aisles may also be determined will now be described.

In data center designs in which there are no ducted racks or hot aisles, some methods for the prediction of ceiling airflow patterns and ceiling tile airflow differ from a raised-floor plenum analysis, such as described in the '832 application in that CRACs remove air from the plenum while perforated ceiling tiles generally supply air to the plenum. Corresponding ceiling and floor-plenum designs do not simply result in identical airflow patterns in the reverse-airflow-direction sense. One reason for this is that higher velocity, regardless of direction, results in lower pressure as can be seen from the Bernoulli Equation:

$$P_i + \frac{1}{2}\rho|V_i|^2 = \text{constant} \quad (7)$$

For raised floors, fast-moving airflow under a tile tends to decrease airflow through the tile. This may be considered unfavorable in designs in which it is desired to introduce cooled air into a data center through a floor plenum. In dropped-ceiling designs, fast-moving airflow through a plenum over a tile in the ceiling tends to increase tile airflow. This may be considered favorable in designs in which it is desired to remove hot air from a data center through a ceiling tile into an overhead plenum. In some designs, floor tiles closest to CRACs may have relatively low outflow while ceiling tiles closest to ducted CRACs may have relatively high inflow.

In some embodiments of the invention, when pressure-dependent flow boundary conditions such as perforated tiles or ducted IT equipment are present, a method of coupling pressure and airflow calculations is used to facilitate determining airflow through a plenum. Two such methods include the Pressure Correction Method and the Airflow Correction Method, described in the '832 application. The Airflow Correction Method may be preferred for raised-floor applications because it is generally the simpler and faster of the two options and provides a sufficient degree of accuracy. For ceiling plenum applications, either the Pressure or Airflow Correction Methods may also be used. The Pressure Correction Method may provide greater accuracy and its formulation for dropped-ceiling applications may be substantially different than for raised-floor applications as, in the former, it serves as the coupling mechanism between the PFM (plenum) and FNM (ducted equipment) pressure predictions. The Airflow Correction Method for ceiling plenum applications is similar to that for raised-floor applications; it introduces additional approximations but may also improve calculation speed and robustness.

In the PFM technique, for airflow which can be modeled as incompressible and irrotational, the airflow pattern may be determined from Poisson's Equation:

$$\nabla^2 \varphi = S''' \quad (8)$$

where $S'''$ is a volumetric-flow-rate source per unit volume and $\varphi$ is the velocity potential, related to the x, y, and z velocity components as follows:

$$u = \frac{\partial \varphi}{\partial x} \quad v = \frac{\partial \varphi}{\partial y} \quad w = \frac{\partial \varphi}{\partial z} \quad (9)$$

Figure 3:
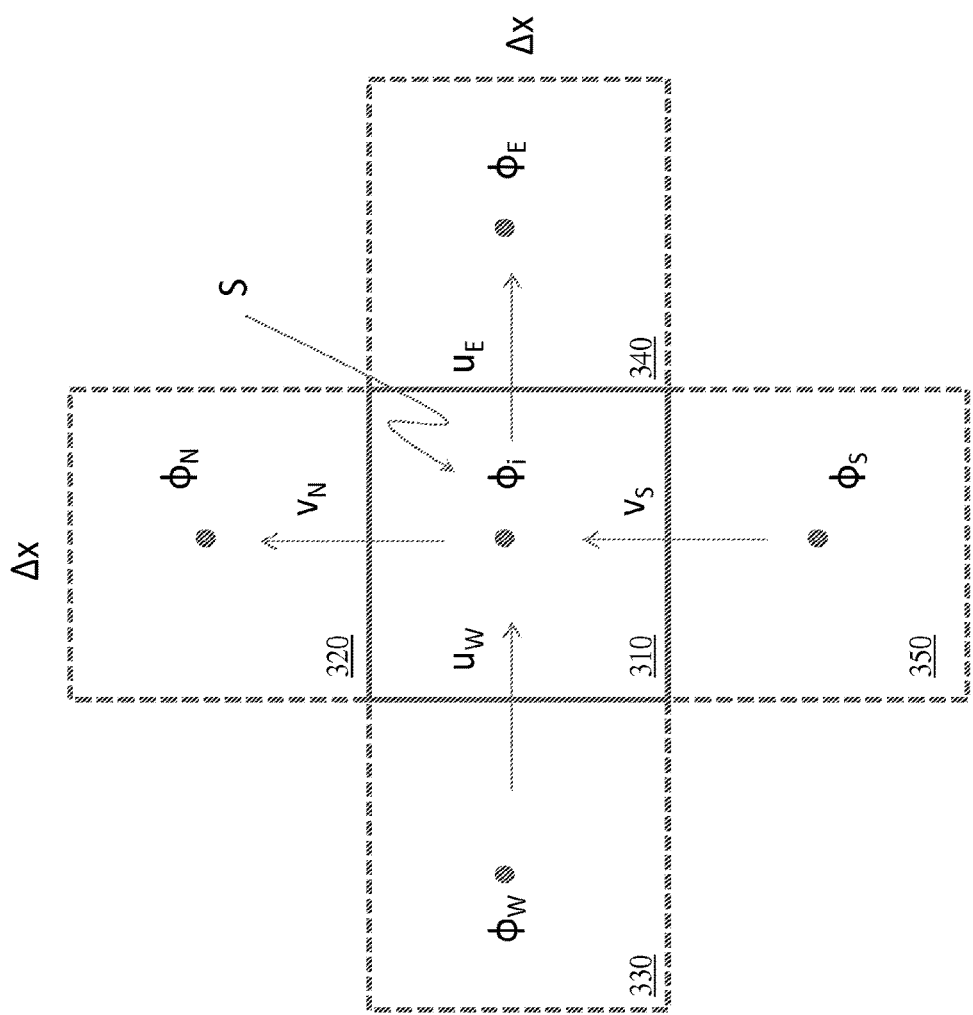
FIG. 3 demonstrates the use of grid cells in accordance with at least one example.

A numerical solution of this problem may be achieved using a Finite Difference method or other discretization methods. Following the Finite Difference method, the physical problem space may be divided into a number of grid cells of size $\Delta x$ by $\Delta x$ by d. One finite difference equation may then be constructed for each grid cell, creating a set of n equations for n unknowns, where n is the number of grid cells. An example of a 2-D grid cell 310 with four neighboring grid cells 320, 330, 340, and 350 is illustrated in FIG. 3. Airflow may enter or exit each side of the grid cell; additional airflow may be added to or subtracted from the grid cell by the source term S which may represent CRAC, IT, tile, or leakage airflow or some combination thereof. The net volumetric flow rate (e.g., in cfm) entering must equal that exiting the grid cell:

$$\Delta x d \left( \frac{\varphi_i - \varphi_W}{\Delta x} \right) + \Delta x d \left( \frac{\varphi_i - \varphi_S}{\Delta x} \right) + S = \Delta x d \left( \frac{\varphi_E - \varphi_i}{\Delta x} \right) + \Delta x d \left( \frac{\varphi_N - \varphi_i}{\Delta x} \right) \quad (10)$$

or, $$\varphi_i = \frac{1}{4} \left( \varphi_N + \varphi_S + \varphi_E + \varphi_W - \frac{S}{d} \right) \quad (11)$$

The form of Equation (11) may change somewhat for grid cells located against a solid wall or in a corner. The set of n equations and n unknowns may be solved iteratively using a standard technique such as the Gauss-Seidel method. (Kreyszig, E., Advanced Engineering Mathematics, Seventh Edition, 1993, John Wiley & Sons, New York. p. 986.)

Once the velocity potentials are determined, velocities may be computed using Equation (9) re-written as a finite-difference approximation:

$$u_{(i+\frac{1}{2},j)} = \frac{\varphi(i+1,j) - \varphi(i,j)}{\Delta x} \quad v_{(i,j+\frac{1}{2})} = \frac{\varphi(i,j+1) - \varphi(i,j)}{\Delta x} \quad (12)$$

where i and j denote grid location in the x and y-directions respectively and the "½" signifies the cell face $\Delta x/2$ away from the cell center in the positive direction.

The plenum pressure distribution may then be determined using the Bernoulli Equation, Equation (7). Airflows and pressures may be coupled using either the iterative Pressure Correction Method or Airflow Correction Method. When only CRACs and perforated tiles are present, it may be preferable to use the Airflow Correction method. When ducted IT equipment is also present, a specific pressure-correction technique, for example, the Pressure Correction Method may be utilized to couple the PFM plenum airflow with FNM equipment airflow as discussed below.

Ducted Equipment Airflow

Figure 4:
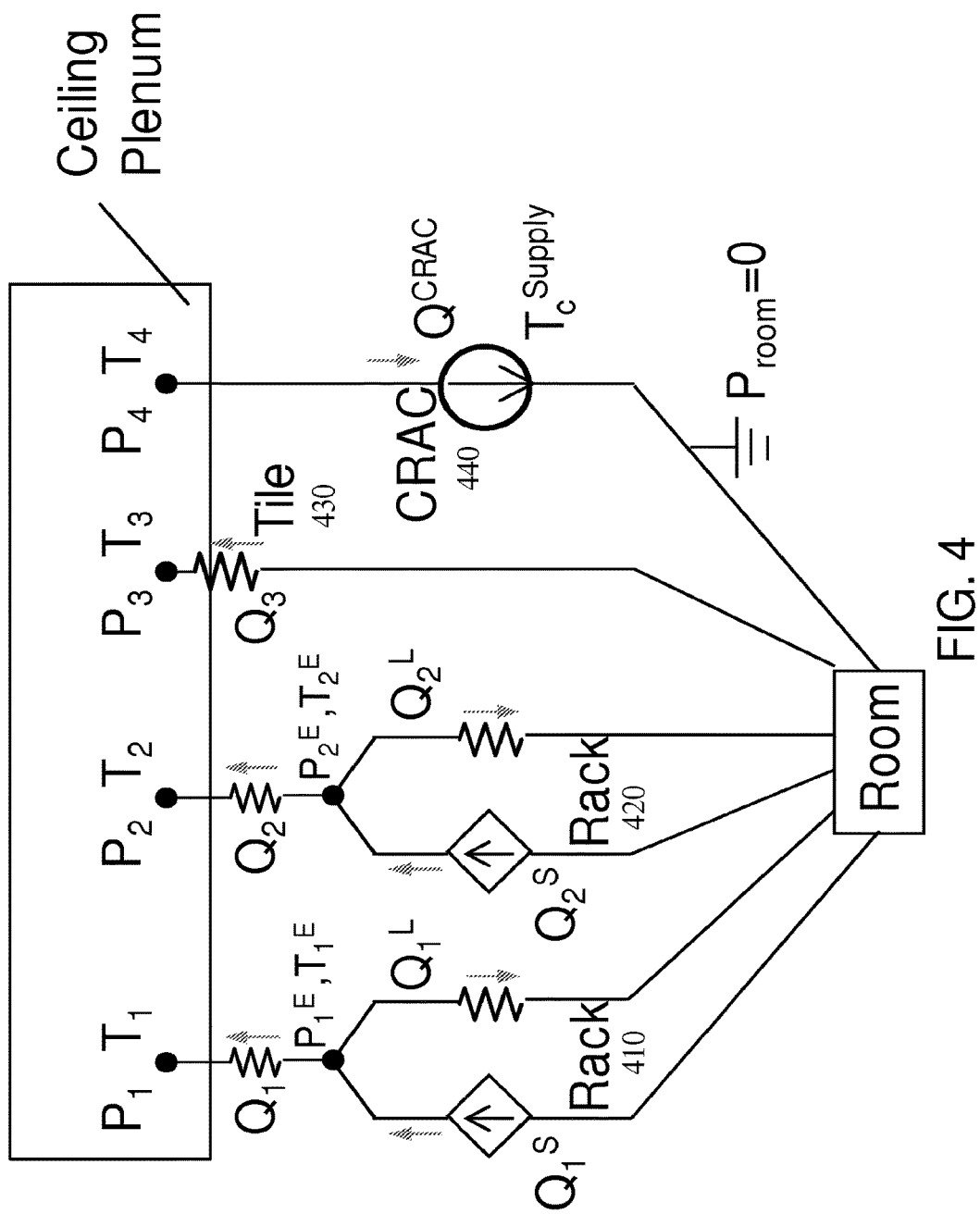
FIG. 4 is a flow network diagram for ceiling equipment and ducted equipment in accordance with an embodiment of the preset invention.

FIG. 4 is a Flow Network diagram of an example of a data center system. For simplicity and clarity, the system described in FIG. 4 includes only two ducted racks, racks 410 and 420, one perforated ceiling tile 430, and one ducted CRAC 440. In the following description, airflow may enter or exit the ceiling plenum only through the ducted equipment perforated tiles (or holes characterized as having very little resistance to airflow), or as assumed leakage airflow. The left-most two vertical legs in FIG. 4 are referred to below as "racks" 410 and 420 but they can equally well represent ducted hot aisles or any other logical grouping of ducted equipment. The third vertical leg from the left represents a perforated ceiling tile 430 and the rightmost vertical leg represents a ducted CRAC 440.

Figure 5:
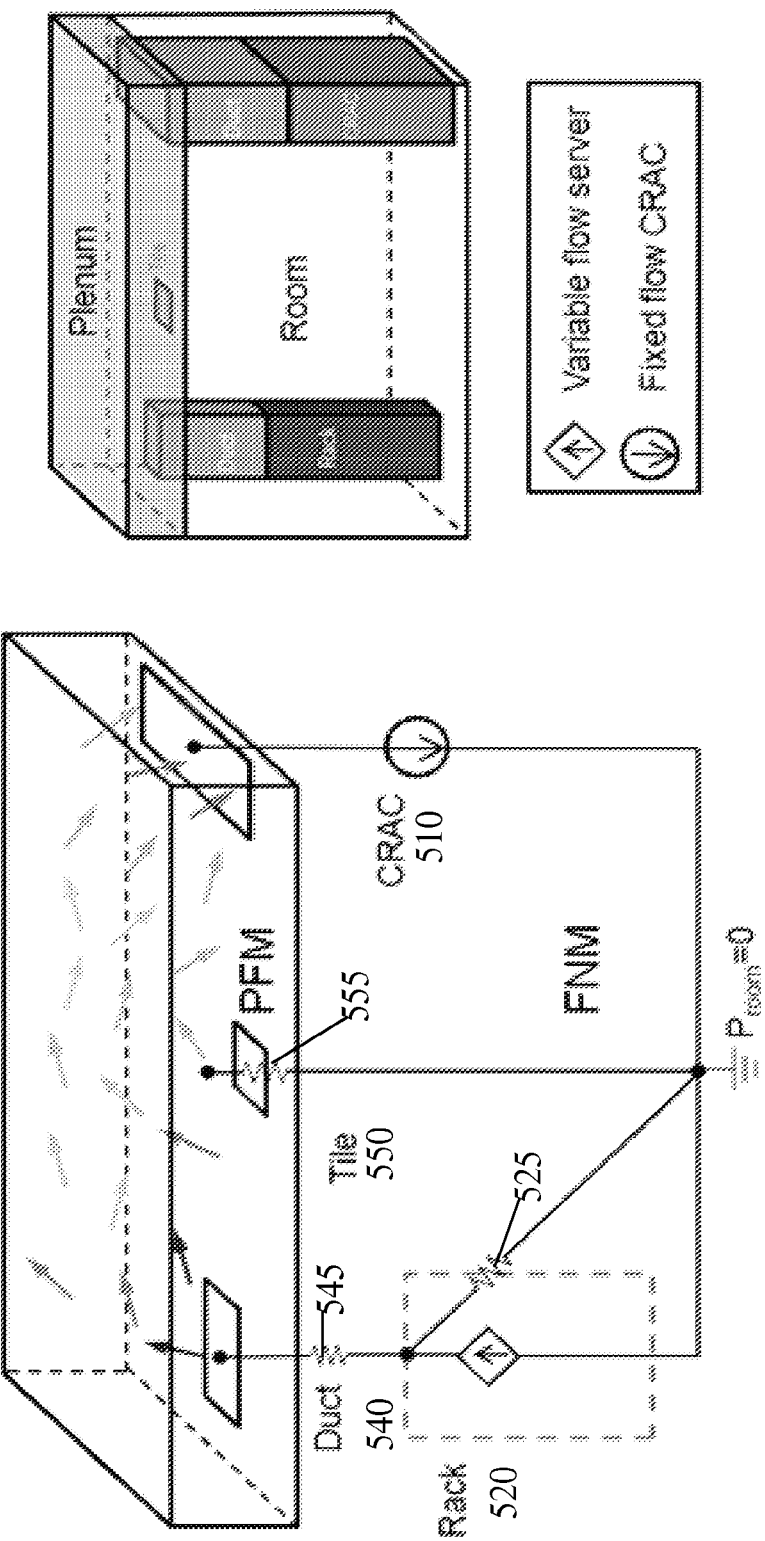
FIG. 5 is a schematic illustration of a mathematical model of a coupled PFM-FNM approach in accordance with an embodiment of the present invention.

The pressure drop experienced by airflow through each resistance element i varies with the square of the flow rate as is typical for turbulent airflow:

$$\Delta P_i = \alpha_i Q_i^2 \quad (13)$$

where the constant $\alpha_i$ characterizes the particular resistance element. In some embodiments the pressure drop of flow-resistance elements may be modeled as linear or some other function of flow rate. A linear model, for example, may trade some accuracy for increased robustness and speed. FIG. 5 is a schematic representation of a mathematical model utilized in some aspects and embodiments of the present invention to determine airflow and/or temperatures within a data center and/or overhead ceiling plenum. In some embodiments, CRACs, for example CRAC 510 of FIG. 5, are modeled as fixed-airflow devices and in other embodiments fan curves, which model airflow as a function of pressure drop across a CRAC, may be included. Racks, for example, rack 520 of FIG. 5, may be modeled as variable-flow sources in parallel with rack leakage resistances 525; racks, in turn, may be placed in series with duct resistances 545 of a duct 540. The variable-flow source represents the server fans installed in the rack 520 which deliver more or less airflow depending on the pressure environment in which they are placed:

$$Q_i^s = Q_i^{nom} \left( 1 - \frac{\Delta P}{P_i^{fan}} \right) \quad (14)$$

where $Q_i^{nom}$ is the nominal airflow rate of the rack when operating in an open environment, $P_i^{fan}$ is the fan stagnation pressure (i.e., the maximum pressure difference against which the fan can supply any finite airflow), and $\Delta P$ is the pressure difference from the exhaust to the inlet of the rack. In some embodiments, the variation of rack airflow with pressure may be negligible so that rack airflow may be taken as a constant value. The rack leakage resistance 525 represents leakage paths from inside the rack to the room, e.g., the roof of the rack, which may have many openings for cable penetrations, and underneath the rack. The duct resistance 545 represents the resistance to airflow imposed by the duct; in practice this may be computed based on well-known duct or pipe-flow resistance calculations. The total duct resistance 545 is proportional to duct length and resistance may, in general, vary with airflow rate to the first power (laminar flow) or second power (turbulent flow) or something in between (transitional flow). In some embodiments, the duct resistance 545 may be considered negligible and may be omitted from the model. In some embodiments, the rack leakage resistance 525 may be considered negligible and omitted from the model.

The data center room environment is defined to be at zero reference pressure. In the configuration of FIG. 4, there are 6 unique pressure nodes: $P_1$, $P_2$, $P_3$, $P_1^E$, $P_2^E$, and $P_{room}$, where the superscript E refers to "exhaust." $P_{room}$ is zero by definition and the correct relative values of $P_1$, $P_2$, and $P_3$ are assumed known at this stage from the PFM analysis of the plenum. "Relative values" means that the difference between any two pressures is known but absolute values are not. This is because, in the PFM analysis of the plenum, the airflow pattern depends on local pressure differences and not absolute values; any arbitrary constant may be added to all pressures in the plenum without changing the flow field. Consequently, in some embodiments, a constant, C, is added to $P_1$, $P_2$, and $P_3$, and C is then computed in such a way that is consistent with both FNM and PFM analyses. The process described here which produces the desired "C" is the Pressure Correction Method for dropped-ceiling systems. Mass balances at nodes $P_1^E$ and $P_2^E$ yield:

$$Q_1^{nom}\left(1 - \frac{P_1^E}{p_1^{fan}}\right) - \text{Sign}(P_1^E)\sqrt{\frac{|P_1^E|}{\alpha_1^L}} = \quad (15)$$

$$\text{Sign}[P_1^E - (P_1 + C)]\sqrt{\frac{|P_1^E - (P_1 + C)|}{\alpha_1^D}}$$

$$Q_2^{nom}\left(1 - \frac{P_2^E}{p_2^{fan}}\right) - \text{Sign}(P_2^E)\sqrt{\frac{|P_2^E|}{\alpha_2^L}} = \quad (16)$$

$$\text{Sign}[P_2^E - (P_2 + C)]\sqrt{\frac{|P_2^E - (P_2 + C)|}{\alpha_2^D}}$$

where the Sign function returns +1, −1, or 0 if the argument is positive, negative, or zero respectively. Superscripts L and D refer to rack leakage resistance and duct resistance respectively.

A mass balance on the ceiling plenum yields:

$$\text{Sign}[P_1^E - (P_1 + C)]\sqrt{\frac{|P_1^E - (P_1 + C)|}{\alpha_1^D}} + \quad (17)$$

$$\text{Sign}[P_2^E - (P_2 + C)]\sqrt{\frac{|P_2^E - (P_2 + C)|}{\alpha_2^D}} - $$

$$\text{Sign}(P_3)\sqrt{\frac{|P_3|}{\alpha_3^T}} = Q_{CRAC}$$

where the superscript T refers to a perforated ceiling tile. Equations (15)-(17) can then be solved for $P_1^E$, $P_2^E$, and C from which the airflow through all flow elements can be determined by application of Equations (13) and (14). The generalization of Equations (15)-(17) to any number of flow elements is straightforward; there are n+1 equations to be solved for n+1 unknowns ($P_1^E$, $P_2^E$, ... $P_N^E$ and C) where n is the number of ducted racks. Furthermore, leakage airflow (i.e., airflow through unintended openings in the dropped ceiling) can be included as either a fixed fraction of total CRAC airflow or modeled as a single, large ceiling tile for which airflow rate depends on the pressure distribution in the plenum.

With the Airflow Correction Method, the correct absolute pressure is never explicitly determined; instead, tile and equipment airflow rates are simply adjusted uniformly up or down in order to achieve a mass balance at each outer iteration (i.e., each time the plenum airflow predictions are updated).

First, the airflow into or out of the dropped ceiling, $Q_i^*$, is computed for all ducted-IT equipment and ceiling tiles from the coupled PFM-FNM technique. These values will not naturally provide a mass balance in the plenum as is the case with the Pressure Correction Method. These values are scaled according to:

$$Q_i = Q_i^* + \frac{(1-f)Q_{CRAC} - \sum_{i=1}^{n} Q_i^*}{n} \quad (18)$$

where f is the total leakage expressed as a fraction of total CRAC airflow, $Q_{CRAC}$ is the total CRAC airflow, and n is the total number of ducted-IT and ceiling tile connections to the plenum. As noted above, while the airflow-correction technique involves additional simplification of the physical model, it improves the speed and robustness of the calculation substantially relative to the pressure-correction technique. It may work particularly well in simpler cases in which duct resistance is omitted and rack airflow is assumed constant.

Computing Airflow with the Coupled PFM-FNM Technique

Figure 6:
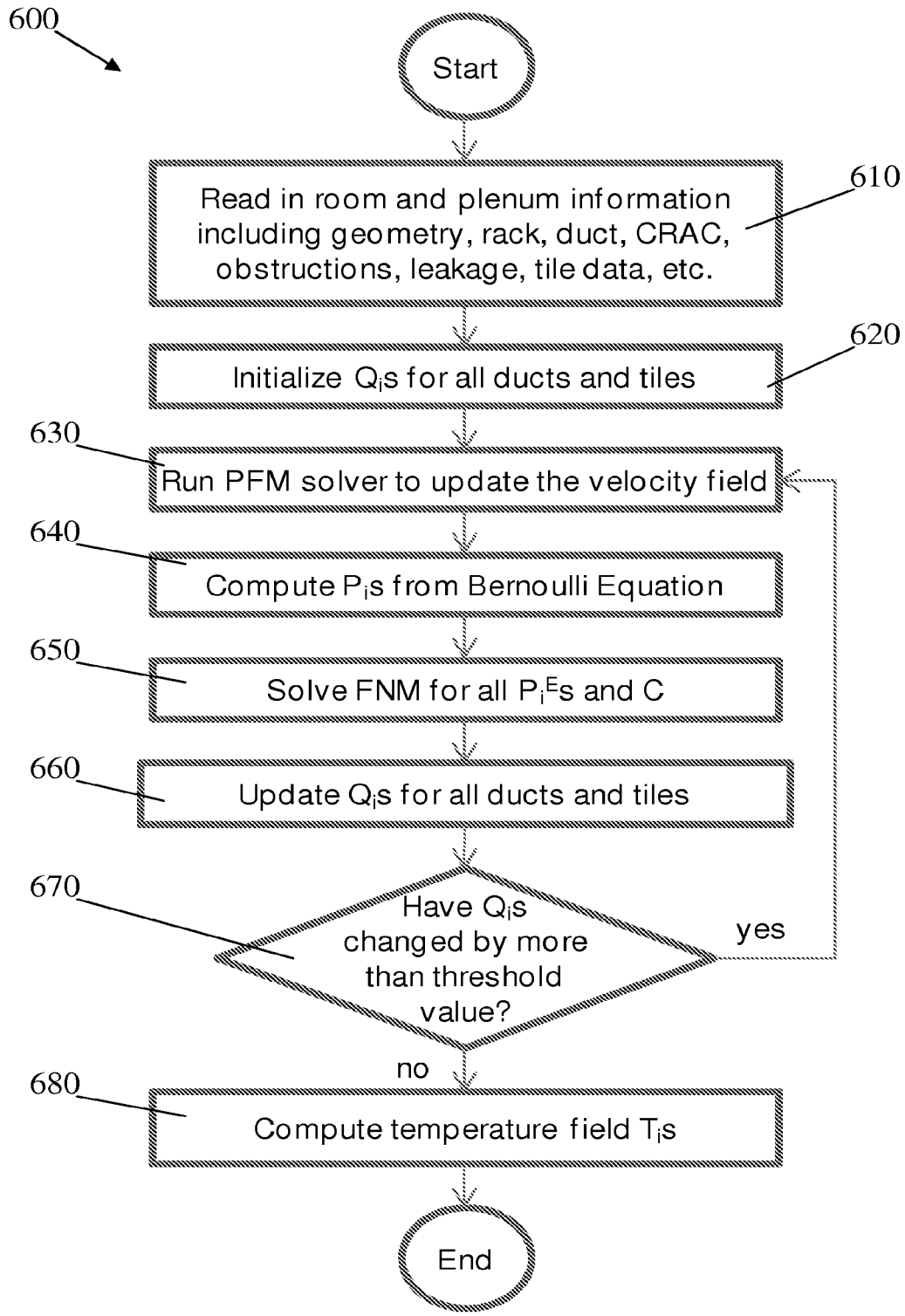
FIG. 6 is a flowchart of a general method in accordance with an embodiment of the preset invention.

The steps in an embodiment of a coupled PFM-FNM utilizing the Pressure Correction method are shown in FIG. 6, illustrated generally at 600. In act 610, data regarding a data center to be analyzed, for example, equipment locations, properties, and configurations are read into a computer system performing the analysis, for example, from a database, or are entered by an operator. Initial guesses, consistent with mass conservation, are made for the airflow through all equipment connected to the plenum (act 620). These initial guesses may be based upon, for example a rated airflow of CRAC units in the data center, or upon known values in similarly designed data centers. With these inputs, the PFM analysis yields the velocity distribution throughout the plenum (act 630). Pressures just above each piece of equipment are computed from the Bernoulli Equation, Equation (7) (act 640). Next, at act 650, the FNM is solved to yield the constant C (along with other FNM pressure values) which allows absolute plenum pressures to be computed. With the absolute plenum pressure estimates, ducted-equipment and tile flow rates can be directly computed from the FNM (act 660). These new flow rates are guaranteed to satisfy a mass balance for the plenum so they can be directly specified again as input to the PFM. The PFM analysis is repeated and the process continues until the equipment airflow rates no longer change from iteration to iteration by more than a pre-defined threshold value (act 670), for example, until:

$$\sqrt{\sum_{i}^{n} \Delta Q_i^2} \le 0.005 \sum_{j}^{N} Q_j^{CRAC} \quad (19)$$

where n is the total number of ducted IT equipment plus perforated tiles, N is the total number of CRACs, and $\Delta Q_i$ is the change of airflow of ducted IT equipment or perforated tile i from iteration to iteration.

Once airflow patterns are determined, temperatures throughout the ceiling-plenum system can be determined (act 680) as discussed below.

Computing Temperatures

In the coupled PFM-FNM approach, temperatures may not affect airflow patterns, so they may be determined separately after airflows are computed as discussed above. The process of determining all temperatures of interest starts with estimates of all ducted-IT or perforated-tile plenum inlet temperatures. The temperatures of all "inflow elements" are set as boundary conditions and the temperature distribution inside the ceiling plenum is determined from an energy balance written for all grid cells:

$$\Sigma Q_k T_k = 0 \quad (20)$$

where $Q_k$ and $T_k$ are the airflow and temperature associated with each identifiable energy stream into or out of the cell of interest. In a 2D plenum analysis, there are 5 terms for cells directly connected to the FNM: one for each cell face plus one for the energy flow in/out of the FNM. In some embodiments, the "upwind" approach may be used for the plenum analysis. The "upwind" approach assumes that airflow from neighboring cells enters the cell of interest at the "upwind" cell temperature and the temperature of all airflow leaving the cell is assumed to be at the single well-mixed cell temperature. One equation of the form of Equation (20) is written for each cell and the coupled linear equations are solved using, for example, the Gauss-Seidel method, or any one of a variety of techniques. The complete ceiling plenum temperature distribution then delivers the temperatures of airflow in the direction out of the plenum and into the FNM.

In the example illustrated in FIG. 4, subsequent to the airflow analysis described above, all FNM airflows are assumed known and in the direction indicated. In embodiments of the method described below, it is assumed that the CRAC has sufficient capacity such that the supply temperature is known. In other embodiments, the supply temperature of the CRAC could be modeled as a function of return temperature and other design parameters associated with the CRAC. An energy balance on the room yields the single well-mixed room temperature:

$$T_{room} = \frac{Q_1^L \Delta T_1 - Q_2^L \Delta T_2 + Q_{CRAC} T_C^{supply}}{Q_1^S + Q_2^S + Q_2 - Q_1^L - Q_2^L} \quad (21)$$

where $\Delta T_i$ is the temperature rise from the rack inlet to exhaust and is a known function of rack power and airflow. The rack exhaust temperature is given by $T_i^{exhaust} = T_{room} + \Delta T_i$ and is not generally equally to $T_i^E$ as the latter may include contributions from the room or the plenum. Once the room temperature is known, all other node temperatures can be determined from inspection of FIG. 4 and temperatures entering the plenum are either the known room temperature (through tiles) or known rack-exhaust temperatures. Further, since the only airflow directed from the plenum to the FNM in this example is through the CRAC (which supplies air at a known temperature), the temperatures in the plenum will not affect the temperatures in the FNM and no additional iteration is required.

The general solution includes any number of flow elements and depends on the direction of airflows into and out of the rack exhaust nodes which affects the node temperatures (i.e., $T_1^E$, $T_2^E$, etc.). Some embodiments assume that server airflow $Q_i^S$ is always in the direction shown in FIG. 4 and that the sign convention of all airflows is positive in the direction indicted by the arrows. For convenience, we define the following three physically-sensible possibilities for the node pressures and resulting node temperatures, $T_i^E$:

Case 1: $T_i^E = T_i^{exhaust}$ for $P_i^E > 0$ and $P_i^E \geq P_i + C$ (22)

Case 2: $T_i^E = \frac{Q_i^S T_i^{exhaust} + Q_i T_i}{Q_i^S + Q_i}$ for $P_i^E > 0$ and $P_i^E < P_i + C$ Case 3: $T_i^E = \frac{Q_i^S T_i^{exhaust} + Q_i^L T_{room}}{Q_i^S + Q_i^L}$ for $P_i^E \leq 0$ and $P_i^E > P_i + C$ The general equation for $T_{room}$ can be shown to be:

$$T_{room} = \frac{Num}{Denom} \quad (23)$$

where $$Num = \sum_{all\ CRACs} Q_{CRAC} T_C^{supply} + \sum_{case\ 1} \text{Max}(Q_i^L, 0) \Delta T_i +$$

$$\sum_{Case\ 2} \text{Max}(Q_i^L, 0) \frac{Q_i^S \Delta T_i + Q_i T_i}{Q_i^S + Q_i} +$$

$$\sum_{case\ 3} \text{Max}(Q_i^L, 0) \frac{Q_i^S \Delta T_i}{Q_i^S + Q_i^L} - \sum_{all\ tiles} \text{Min}(Q_{tile}, 0) T_{tile}$$

and $$Denom = \sum_{all\ racks} Q_i^S - \sum_{all\ racks} \text{Min}(Q_i^L, 0) + \sum_{all\ tiles} \text{Max}(Q_{tile}, 0) -$$

$$\sum_{case\ 1} \text{Max}(Q_i^L, 0) - \sum_{Case\ 2} \text{Max}(Q_i^L, 0) \frac{Q_i^S}{Q_i^S + Q_i} \sum_{case\ 3} \text{Max}(Q_i^L, 0)$$

The summations in Equation (23) taken over "Case 1", "Case 2", and "Case 3" include only those racks which fall into these cases per Equations (22). The Max and Min functions are shorthand which allows certain terms to be included only when airflows are in a particular direction.

Equations (23) and (22) provide the temperatures for the room and all rack exhaust nodes respectively. For flow directed into the plenum, the exhaust node temperature is equal to the temperature entering the plenum. For flow directed out of the plenum, the temperature leaving the plenum is determined from the PFM analysis. For cases in which there are any perforated-tile or ducted-IT equipment (for example, equipment rack) airflows in the direction out of the ceiling plenum, iteration may be used. In this case, airflow from the ceiling plenum can affect the room temperature and, consequently, other temperatures throughout the FNM, which, in turn, can affect temperatures in the ceiling plenum.

Figure 7:
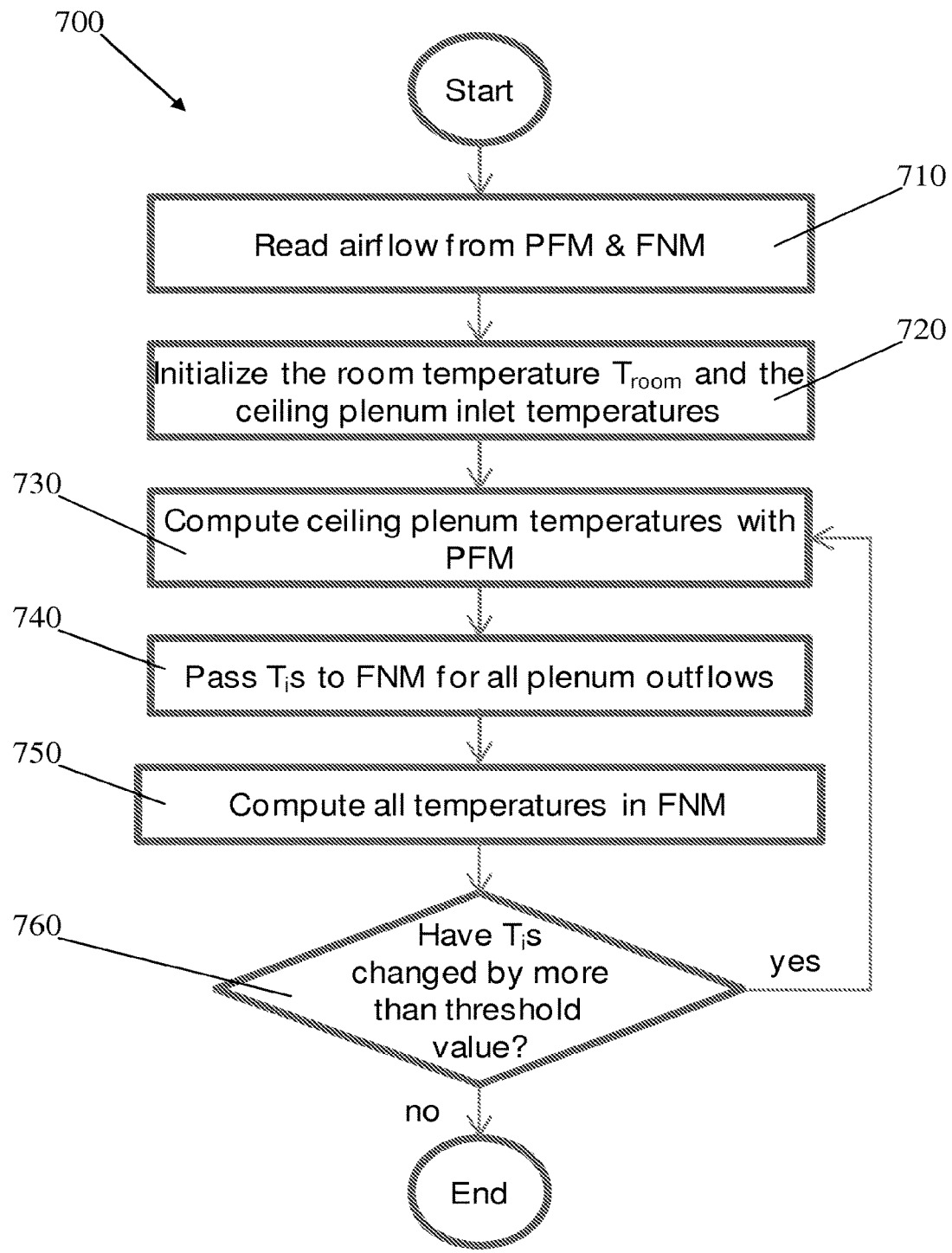
FIG. 7 is a flowchart of a temperature-prediction method in accordance with an embodiment of the preset invention.

A process in accordance with an embodiment of the present invention for determining all temperatures in the ceiling plenum and FNM are shown in FIG. 7. In act 710, airflows for the data center, including through racks, tiles, plenum(s), duct(s), and CRAC(s), is read or entered into a computer for performing the analysis. These airflows may have been calculated using a coupled PFM-FNM approach such as that described in FIG. 6.

In act 720, the room temperature and the temperatures for inlets into the ceiling plenum are estimated, for example, from known temperature contributions to rack exhaust temperatures from rack power and airflow as described above. Temperatures within and exiting the ceiling plenum are then calculated using a PFM analysis (act 730). The calculated temperatures are then used as inputs for an FNM analysis (act 40) to determine all temperatures at each point in the Flow Network Model (for example, rack exhaust inlets into the plenum, perforated tiles, and plenum/cooler interfaces) in act 750. If the FNM analysis results in a determination of ceiling plenum temperatures which differ from the temperatures calculated in act 730 by more than a user defined threshold value (decision box 760), the PFM and FNM analysis may be iterated (arrow from act 760 to act 730).

When iteration is used, the PFM and FNM solvers may be run sequentially until the equipment temperatures (at plenum/room boundary) no longer change from iteration to iteration by more than a pre-defined threshold value. For example, until:

$$\sqrt{\sum_i^n \Delta T_i^2} \le 0.005 \frac{P_{total}}{\rho c_P \sum_j^N Q_j^{CRAC}} \quad (24)$$

where n is the total number of ducted IT equipment plus perforated tiles, N is the total number of CRACs, $P_{total}$ is the total IT power dissipated in the entire room, and $\Delta T_i$ is the change in temperature of ducted IT equipment (for example, equipment racks) or perforated tile i from iteration to iteration. In Equation (24), the term on the right-hand side may be interpreted as the average temperature difference across all CRAC units and serves as reasonable temperature scale to which temperature variations from iteration to iteration may be compared.

Finally, in one embodiment, the model described above may be combined with a general room temperature prediction model such as that discussed in the '862 application. This allows for a general room-temperature prediction including all ducted and un-ducted equipment and can be used to provide estimates of inlet temperatures to all racks and return temperatures of all cooling units (which may or may not be ducted to the ceiling plenum.)

EXAMPLE

Figure 8A:
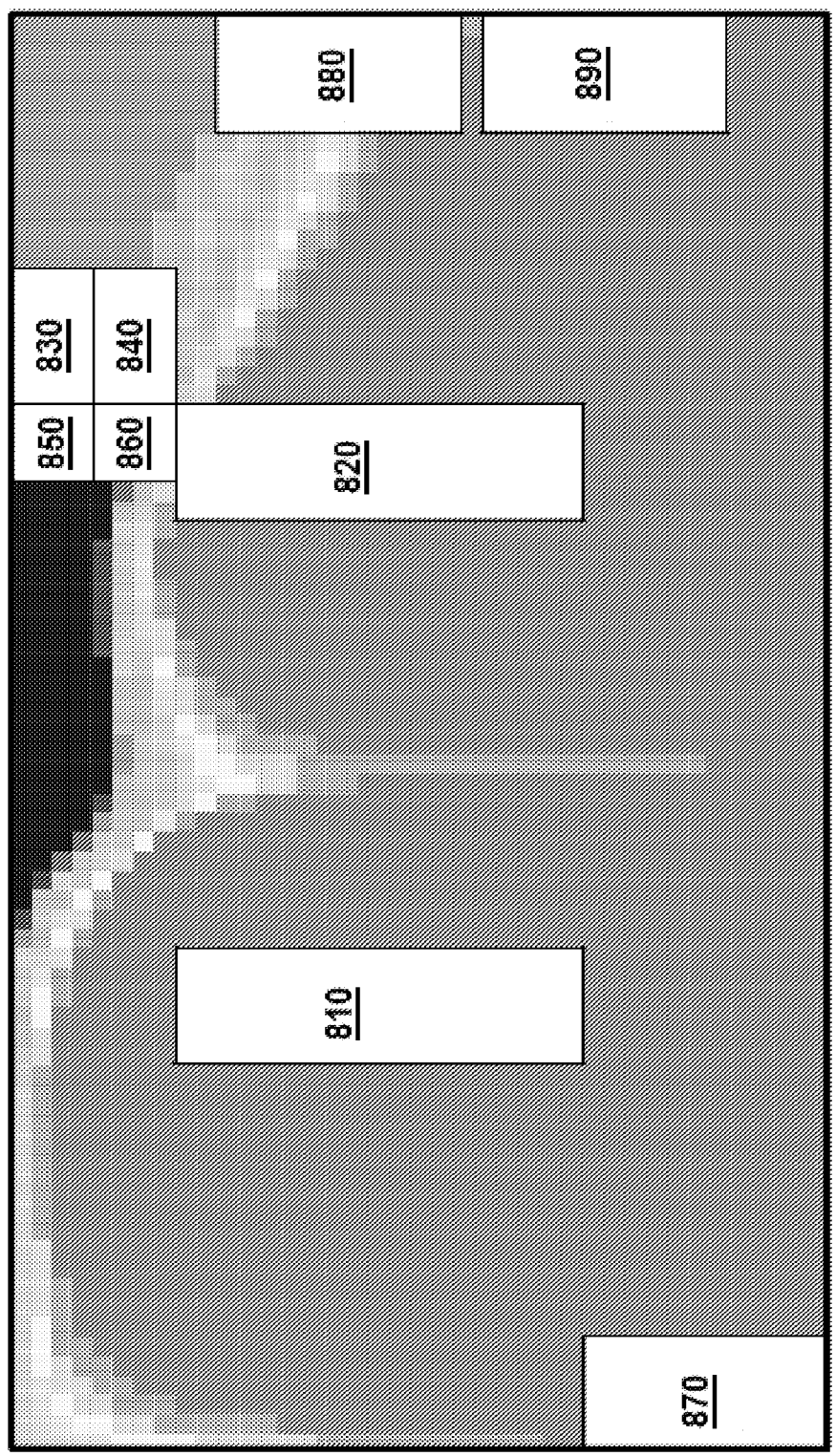
FIG. 8A is a schematic illustration of a distribution of temperature calculated by a method in accordance with the present invention in an example data center in a first configuration.
Figure 8B:
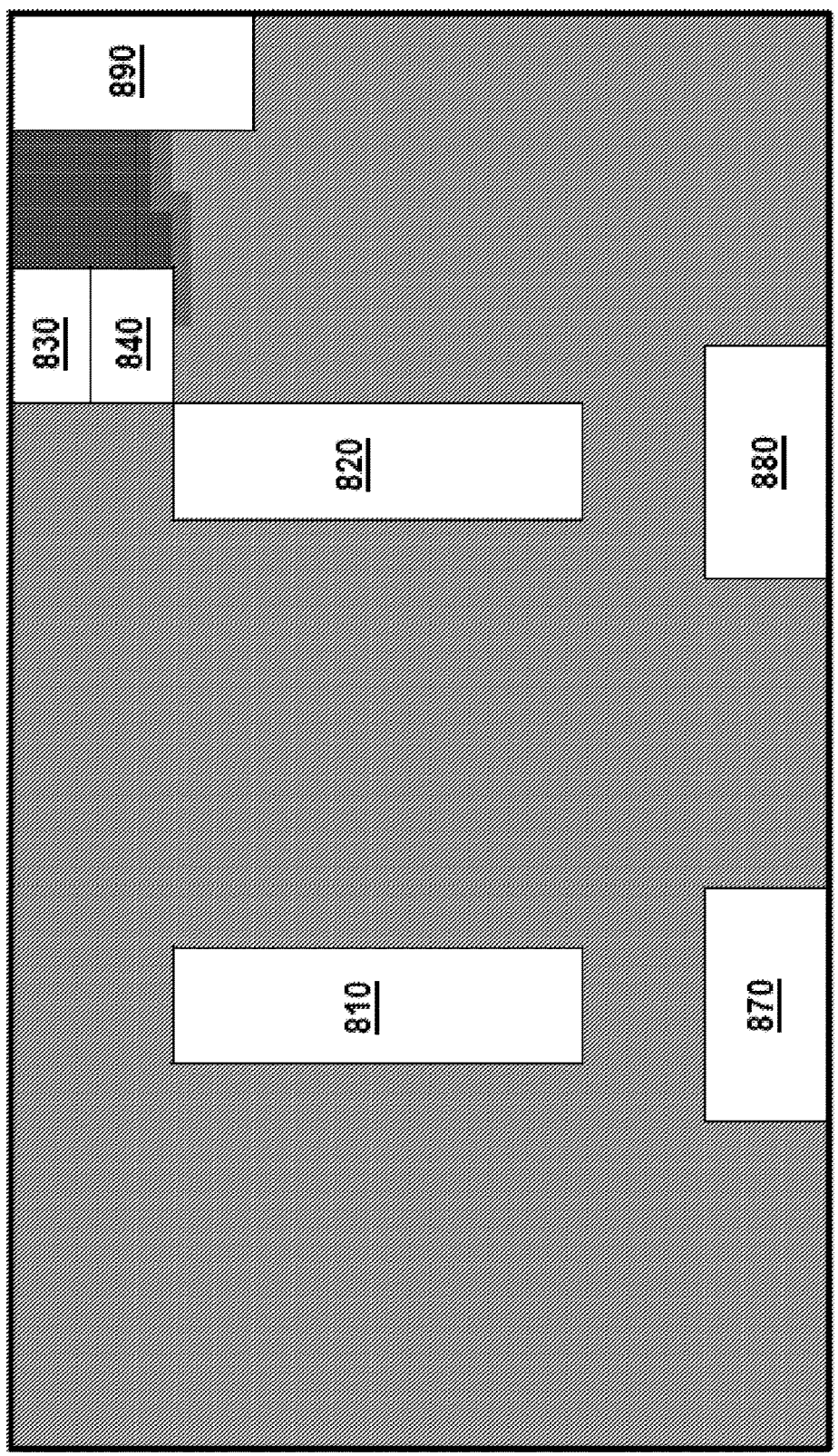
FIG. 8B is a schematic illustration of a distribution of temperature calculated by a method in accordance with the present invention in an example data center in a second configuration.

FIGS. 8A and 8B show an example application of an embodiment of a method in accordance with the present invention. The plenum is shaded based on temperature with darker shades representing cooler areas and lighter shades representing warmer areas. This example assumes that the methodology has been built into design software with which the user may explore alternative design choices.

FIG. 8A shows the initial design consisting of two ducted hot aisles 810 and 820, two ducted racks 830 and 840, two perforated tiles 850 and 860, and three CRAC units 870, 880, and 890. Data associated with the ducted hot aisles are a percentage airflow and an average temperature. The percentage airflow is the ratio of duct airflow to ducted IT airflow; ideally, this ratio will be 100% and can be used to assess the cooling performance of ducted racks. If it is more than 100% then extra leakage airflow is generally being drawn into the plenum—this may indicate poor cooling efficiency but good cooling reliability; if it is less than 100%, then some airflow is generally leaking out of the rack into the room—this may indicate poor cooling efficiency and reliability. The word "generally" is used to cover practical data center applications in which the IT equipment flow rate does not vary significantly due to the presence of the ducting. Similarly, other data associated with the perforated tiles and CRACs are the total airflow and temperature. These data are summarized in Table 2 below:

TABLE 2

Example Data - Initial Design

| Equipment Item | Temperature (°Fahrenheit) | Airflow (cfm: tiles, CRACS), Percentage Airflow (Ducts) |
|---|---|---|
| Aisle 810 | 93.6 | 91% |
| Aisle 820 | 93.5 | 105% |
| Rack 830 | 72.2 | 98% |
| Rack 840 | 73 | 108% |
| Tile 850 | 68 | 913 |
| Tile 860 | 71.8 | 981 |
| CRAC 870 | 93.5 | 8,000 |
| CRAC 880 | 93.1 | 8,000 |
| CRAC 890 | 93.6 | 8,000 |

It is clear from the initial design that a) the airflow through the ducted equipment is not properly matched to IT airflow and b) the two CRACS see significantly different return temperatures and therefore imbalanced loading.

FIG. 8B shows an improved design. It was found by experimentation with the tool that improvements could be made by 1) moving the CRAC units to closely match equipment needs, 2) eliminating the ceiling tiles to avoid bypassing airflow. Improvements can be seen by observing the increased percentage airflow at ducts and the better uniformity of CRAC return temperatures in Table 3 below.

TABLE 3

Example Data - Improved Design

| Equipment Item | Temperature (°Fahrenheit) | Airflow (cfm: tiles, CRACS), Percentage Airflow (Ducts) |
|---|---|---|
| Aisle 810 | 93.6 | 107% |
| Aisle 820 | 93.6 | 107% |
| Rack 830 | 95.6 | 106% |
| Rack 840 | 96 | 107% |
| Tile 850 | n/a | n/a |
| Tile 860 | n/a | n/a |
| CRAC 870 | 93.6 | 8,000 |
| CRAC 880 | 93.6 | 8,000 |
| CRAC 890 | 94.8 | 8,000 |

In embodiments above, processes and systems are provided that can determine relevant airflow rates and temperatures in a data center. The systems and methods can be used to provide optimized design of a data center by using results of the systems and methods to change the actual layout and/or capacity of equipment or the proposed layout and/or capacity of equipment. In processes described above, values related to data center cooling, including airflows and temperatures may be determined. In at least some embodiments, the values determined are predictions for actual values that will occur in a data center having the parameters modeled. In methods of at least one embodiment of the invention, after successful modeling of a cluster in a data center, the results of the model may be used as part of a system to order equipment, ship equipment and install equipment in a data center as per the designed layout.

In at least some embodiments described herein, airflow in a plenum is described as being generated by a CRAC. Systems and methods described herein can be used with other types of sources of air in plenums, including other types of cooling devices and fans. In at least some embodiments, methods are described as determining specific airflows and the change in these airflows resulting from a redesign of a layout of a data center. In at least some embodiments, the determination is a prediction or estimation of actual airflows.

In at least some embodiments of the invention discussed herein, the performance of assessments and calculations in real-time refers to processes that are completed in a matter of a few seconds or less rather than several minutes or longer as can happen with complex calculations, such as those involving typical CFD calculations.

In at least some embodiments described above, the design of a data center and/or actual parameters in a data center are altered based on predicted temperature and/or airflow and/or the change in temperature and/or airflow upon the occurrence of a cooling system failure in a data center. For example, a user of the data center design and management system may change the location of coolers or the types of coolers that are used in the actual layout of equipment or the proposed layout of equipment in the data center. These alterations may be implemented to improve the cooling performance and/or may be implemented to provide cost and/or power savings when the performance is found to be within predetermined specifications. Further, based on determined airflow values, a data management system in accordance with one embodiment may control one or more CRACs to adjust the airflow, and in addition, one or more equipment racks can be controlled to reduce power if the airflow is not adequate to provide sufficient cooling.

In at least some embodiments described above, tools and processes are provided for determining temperatures and airflows in a data center. In other embodiments, the tools and processes may be used in other types of facilities, and may also be used in mobile applications, including mobile data centers. Further, processes and systems in accordance with embodiments described herein may be used in overhead air plenums, and other types of air plenums.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for evaluating ceiling plenum airflow patterns and cooling performance of equipment in a data center, the equipment including a plurality of equipment racks and one or more cooling providers, the method comprising:
   receiving data related to types of equipment and an arrangement of equipment in the data center including a location and configuration of the plurality of equipment racks and one or more hot aisles;
   receiving data related to locations and configurations of one or more perforated ceiling tiles providing fluid communication between the one or more hot aisles and a ceiling plenum;
   determining a first quantity of air exhausted from one of the plurality of equipment racks;
   determining a second quantity of air captured by the one or more perforated ceiling tiles which is exhausted from the one of the plurality of equipment racks using an algebraic calculation method, the second quantity of air being determined based in part on geometric distances of the one or more perforated ceiling tiles from the one of the plurality of equipment racks;
   determining a hot aisle capture index for the one of the plurality of equipment racks based in part on the first quantity of air and the second quantity of air, the hot aisle capture index being defined as the ratio of net airflow captured and net airflow supplied at a location of the ceiling plenum;
   storing, on a storage device, an indication of the hot aisle capture index; and
   controlling at least one of a cooling provider of the one or more cooling providers and one or more equipment racks of the plurality of equipment racks based on the hot aisle capture index.

2. The method of claim 1, wherein determining the hot aisle capture index further includes determining fractions of air captured by each of the one or more perforated ceiling tiles which is exhausted from the one of the plurality of equipment racks.

3. The method of claim 2, wherein determining the hot aisle capture index further includes determining a third quantity of air captured by the one or more cooling providers which is exhausted from the one of the plurality of equipment racks.

4. The method of claim 3, wherein determining the hot aisle capture index further includes determining fractions of air captured by each of the one or more cooling providers which is exhausted from the one of the plurality of equipment racks.

5. The method of claim 4, wherein determining the hot aisle capture index further includes summing the fractions of air captured by each of the one or more perforated ceiling tiles and the fractions of air captured by each of the one or more cooling providers.

6. The method of claim 4, wherein the one or more cooling providers includes a first cooler in a first row and a second cooler in a second row.

7. The method of claim 6, wherein the first row is adjacent the second row and the one of the plurality of equipment racks is positioned in the first row.

8. The method of claim 1, further comprising installing equipment in the data center based on the hot aisle capture index.

9. A system for evaluating ceiling plenum airflow patterns and cooling performance of equipment in a data center, the equipment including a plurality of equipment racks and one or more cooling providers, the system comprising:
   an interface;
   a controller coupled to the interface and configured to:
      receive data related to types of equipment and an arrangement of equipment in the data center including a location and configuration of the plurality of equipment racks and one or more hot aisles;
      receive data related to locations and configurations of one or more perforated ceiling tiles providing fluid communication between the one or more hot aisles and a ceiling plenum;
      determine a first quantity of air exhausted from one of the plurality of equipment racks;
      determine a second quantity of air captured by the one or more perforated ceiling tiles which is exhausted from the one of the plurality of equipment racks using an algebraic calculation method, the second quantity of air being determined based in part on geometric distances of the one or more perforated ceiling tiles from the one of the plurality of equipment racks;
      determine a hot aisle capture index for the one of the plurality of equipment racks based in part on the first quantity of air and the second quantity of air, the hot aisle capture index being defined as the ratio of net airflow captured and net airflow supplied at a location of the ceiling plenum;

store, on a storage device, an indication of the sufficiency of airflow through the plurality of equipment racks; and control at least one of a cooling provider of the one or more cooling providers and one or more equipment racks of the plurality of equipment racks based on the hot aisle capture index.

10. The system of claim 9, wherein the controller is further configured to determine fractions of air captured by each of the one or more perforated ceiling tiles which is exhausted from the one of the plurality of equipment racks.

11. The system of claim 10, wherein the controller is further configured to determine a third quantity of air captured by the one or more cooling providers which is exhausted from the one of the plurality of equipment racks.

12. The system of claim 11, wherein the controller is further configured to determine fractions of air captured by each of the one or more cooling providers which is exhausted from the one of the plurality of equipment racks.

13. The system of claim 12, wherein the controller is further configured to sum the fractions of air captured by each of the one or more perforated ceiling tiles and the fractions of air captured by each of the one or more cooling providers.

14. The system of claim 12, wherein the one or more cooling providers includes a first cooler in a first row and a second cooler in a second row.

15. The system of claim 14, wherein the first row is adjacent the second row and the one of the plurality of equipment racks is positioned in the first row.

16. A non-transitory computer readable medium having stored thereon sequences of instructions including instructions that will cause a processor to:

receive data related to types of equipment and an arrangement of equipment in a data center including a location and configuration of a plurality of equipment racks and one or more hot aisles;

receive data related to locations and configurations of one or more perforated ceiling tiles providing fluid communication between the one or more hot aisles and a ceiling plenum;

determine a first quantity of air exhausted from one of the plurality of equipment racks;

determine a second quantity of air captured by the one or more perforated ceiling tiles which is exhausted from the one of the plurality of equipment racks using an algebraic calculation method, the second quantity of air being determined based in part on geometric distances of the one or more perforated ceiling tiles from the one of the plurality of equipment racks;

determine a hot aisle capture index for the one of the plurality of equipment racks based in part on the first quantity of air and the second quantity of air, the hot aisle capture index being defined as the ratio of net airflow captured and net airflow supplied at a location of the ceiling plenum;

store, on a storage device, an indication of the hot aisle capture index; and control at least one of a cooling provider of the one or more cooling providers and one or more equipment racks of the plurality of equipment racks based on the hot aisle capture index.

* * * * *